(12) United States Patent
Cheng et al.

(10) Patent No.: US 7,217,996 B2
(45) Date of Patent: May 15, 2007

(54) BALL GRID ARRAY SOCKET HAVING IMPROVED HOUSING

(75) Inventors: Jun Cheng, Kunsan (CN); Hui Ye, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/078,164

(22) Filed: Mar. 10, 2005

(65) Prior Publication Data

US 2005/0200016 A1 Sep. 15, 2005

(30) Foreign Application Priority Data

Mar. 12, 2004 (CN) .......................... 2004 2 0025371

(51) Int. Cl.
*H01L 23/04* (2006.01)
(52) U.S. Cl. .................. 257/698; 257/700; 257/737; 257/E23.067; 257/E23.069
(58) Field of Classification Search ................ 257/692, 257/693, 698, 700, 737, 774, 784, E23.011, 257/E23.067, E23.069; 361/774, 791
See application file for complete search history.

(56) References Cited

U.S. PATENT DOCUMENTS

| 6,116,922 | A  | * | 9/2000 | Szu et al. ...................... 439/83 |
| 6,362,437 | B1 | * | 3/2002 | Arai ........................... 174/260 |
| 6,438,826 | B2 | * | 8/2002 | Takase et al. .................. 29/855 |
| 6,558,170 | B1 | * | 5/2003 | Lemke ......................... 439/83 |

* cited by examiner

*Primary Examiner*—Minh-Loan Tran
(74) *Attorney, Agent, or Firm*—Wei Te Chung

(57) ABSTRACT

A ball grid array (BGA) socket includes an insulative housing (11), a number of terminals (12) and a protecting device (114). The insulative housing includes a mating surface (111), a mounting surface (112) opposite to mating surface, a plurality of passageways (113) extending between the mating surface and the mounting surface and a plurality of electrical terminals (12) received in the passageways. Each of the terminals includes a body portion (121); a contacting portion (122) extending forwardly from the body portion and a soldering portion (123) extending downwardly from the body portion and extending beyond the mounting surface of the insulative housing. The protecting device is arranged on the mounting surface. In a perpendicular direction, a distance between a bottom surface of the protecting device and the mounting surface is longer or equal to another distance between soldering portion and the mounting surface.

18 Claims, 4 Drawing Sheets

BALL GRID ARRAY SOCKET HAVING IMPROVED HOUSING

BACKGROUND OF THE INVENTION

1. Field of the Invention

The present invention relates to the art of electrical connectors, and more particularly to a ball grid array (BGA) socket establishing an electrical connection between an IC module and a printed circuit board (PCB).

2. Background

A typical BGA socket includes an insulative housing receiving a plurality of electronic terminals arrayed therein for electrically connecting an IC module and a PCB. Therefore, an electric connection between the IC module and the PCB is built. The insulative housing has a mating surface and a mounting surface opposite to the mating surface. A plurality of openings are defined in the insulative housing to receive corresponding terminals.

Each terminal includes a base portion, a contacting portion extending upwardly from a top end of the base portion and a soldering portion extending downwardly from another end of the base portion. Each soldering portion includes a soldering surface to be soldered with corresponding soldering element for achieving an electrical connection thereof. In order to improve the high temperature in the soldering surface during the soldering process, the soldering surface needs to be designed to extend beyond the mounting surface.

One problem with this design of the housing is that when the soldering portion is positioned outside of the mounting surface of the housing, the soldering portion may be prone to receive an external force attack, and the coplanarity of the soldering portion will be damaged. Thus, the connection between the soldering element and the soldering portion will be blighted, and then a fault connection between the BGA socket and the PCB will also be brought.

What is needed is, therefore, a BGA socket which overcomes the aforesaid disadvantages.

SUMMARY

To fulfill the above-mentioned object, a BGA socket in accordance with preferred embodiment of the present invention is provided. The BGA socket comprises an insulative housing, a plurality of terminals and a protecting device.

The insulative housing includes a mating surface, a mounting surface opposite to mating surface, a plurality of passageways extending through the mating surface and the mounting surface. The terminals are received in the passageways of the insulative housing, respectively. Each of the terminals includes a body portion; a contacting portion extending forwardly from the body portion and a soldering portion extending from the body portion and including a soldering surface extending beyond the mounting surface of the insulative housing. The protecting device is arranged in the mounting surface. In a perpendicular direction, a distance between a bottom surface of the protecting device and the mounting surface is longer or equal to another distance between soldering surface and the mounting surface.

DETAILED DESCRIPTION OF PREFERRED EMBODIMENT

Reference will now be made to the drawings to describe the present invention in detail.

Figure 1:
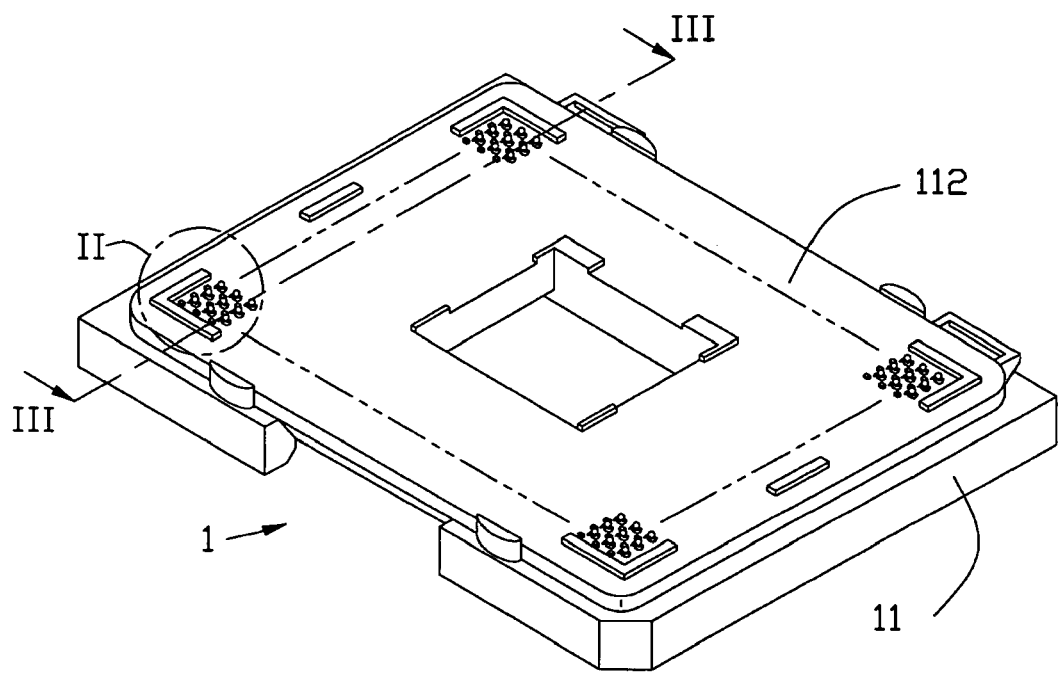
FIG. 1 is an assembled and perspective view of a preferred embodiment of the present invention.
Figure 2:
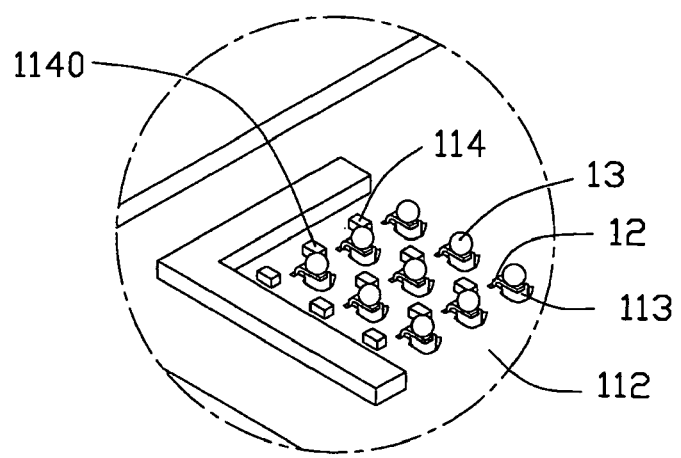
FIG. 2 is an enlarged view of circled part in FIG. 1.
Figure 3:
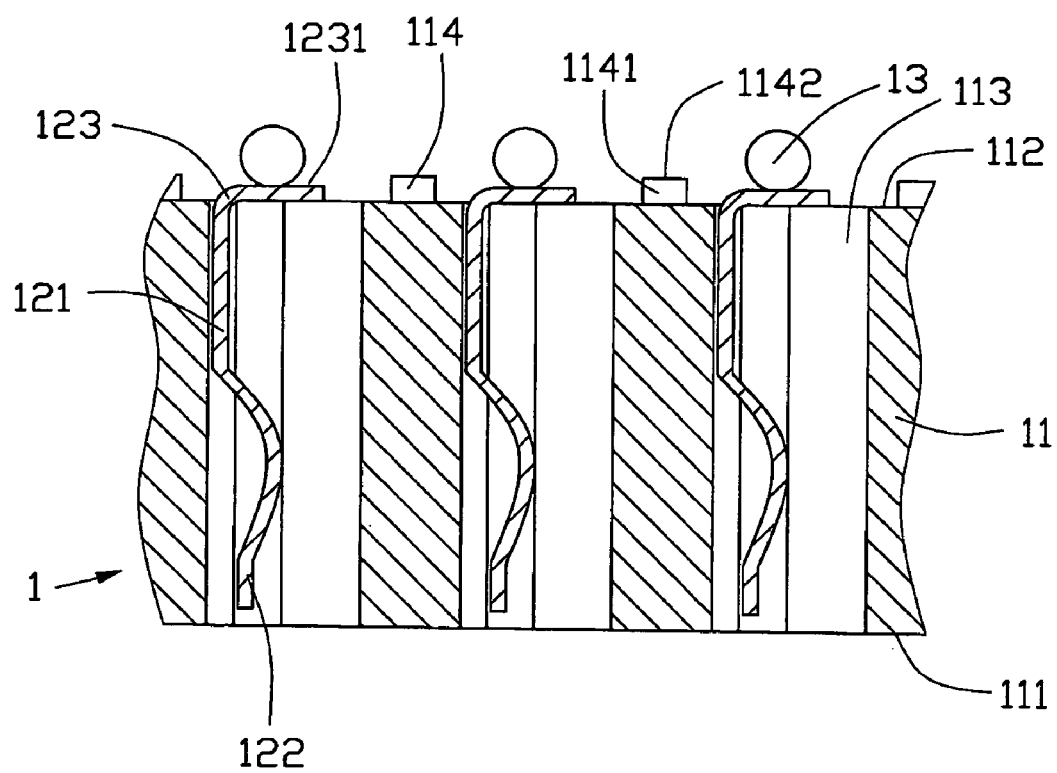
FIG. 3 is a cross-section view along a line III—III in FIG. 1.

Referring to FIGS. 1–3, a BGA socket 1 in accordance with a preferred embodiment of the present invention is illustrated. The BGA socket 1 may be used to connect an IC module (not shown) and a PCB (not show) for establishing an electrical connection between the IC module and the PCB, but not limited thereto. The BGA socket 1 includes an insulative housing 11 and a plurality of terminals 12 retained in the insulative housing 11. The terminals 12 are soldered to the PCB via soldering elements. In this embodiment, the soldering elements are soldering balls 13.

The insulative housing 11 includes a mating surface 111 mating with the IC module, a mounting surface 112 opposite to the mating surface 111 for mounting to the PCB, and a plurality of passageways 113 extending through the mating surface 111 and the mounting surface 112 for receiving the corresponding terminals 12.

A protecting device 114 is formed with the insulative housing 11 integrally and arranged in the mounting surface 112. In this embodiment, the protecting device 114 includes a plurality of lump-shaped protrusion 1140 and each protrusion 1140 arranged between each two adjacent passageways 113. The protrusion 1140 includes a base 1141 with a bottom surface 1142 distanced from the mounting surface 112.

Each terminal 12 includes a body portion 121, a connecting portion 122 extending upwardly from the connecting portion 122 for connecting with a corresponding conductor of the IC module and a soldering portion 123 extending downwardly from the body portion 121. A soldering surface 1231 extends from an end of the soldering portion 123 and extends beyond the mounting surface 112. Along a perpendicular direction with respect to a top surface of the PCB, a vertical distant between the bottom surface 1142 of the protrusion 1140 and the mounting surface 112 of the insulative housing 11 is larger than or equal to another vertical distant between the soldering surface 1231 of the soldering potion 123 and the mounting surface 112 of the insulative housing 11, but is smaller than a vertical distance between a bottom surface of the soldering ball 13 and the mounting surface 112 after the soldering ball 13 is soldered on the soldering surface 1231 of the solder portion 123, wherein the soldering ball 13 has a top surface that is in contact with the soldering surface 1231 of the soldering portion 123, and the bottom surface opposite to the top surface or located away from the soldering surface 1231 of the soldering portion 123.

When the BGA socket 1 is assembled on the PCB, the soldering portion 123 is soldered with a corresponding conductor of the PCB via the soldering ball 13, and the IC module mates with the BGA socket 1 while the conductor of the IC module connecting to the connecting portion 122 of the terminal 12. Therefore, an electrical connection between the IC module and the PCB is established.

This design of the protecting device 114 can avoid inappropriate exterior force to hit the soldering portion 123 to affect the coplanarity thereof and break the electrical connection between the BGA socket 1 and the PCB.

Figure 4:
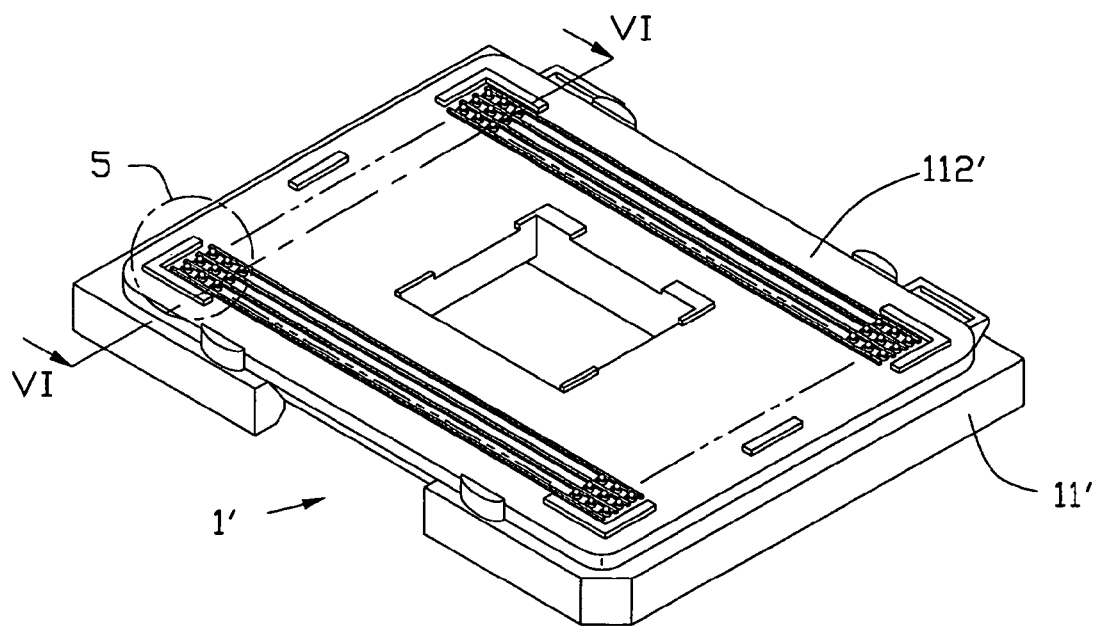
FIG. 4 is an assembled and perspective view of another preferred embodiment of the present invention.

Referring to FIG. 4 that shows another embodiment. A BGA socket 1' includes an insulative housing 11' and a plurality of terminals 12' retained in the insulative housing 11'.

Figure 5:
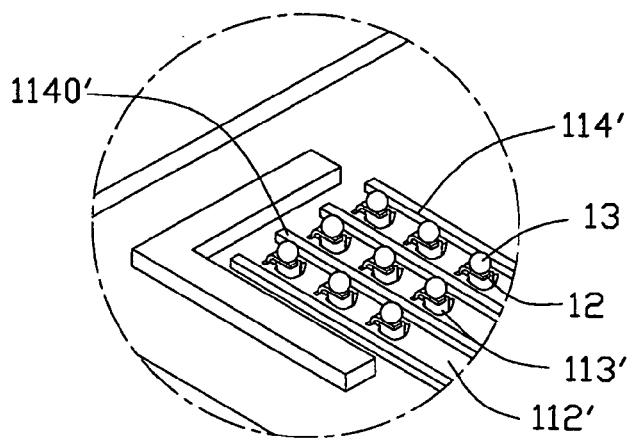
FIG. 5 is an enlarged view of circled part in FIG. 4.
Figure 6:
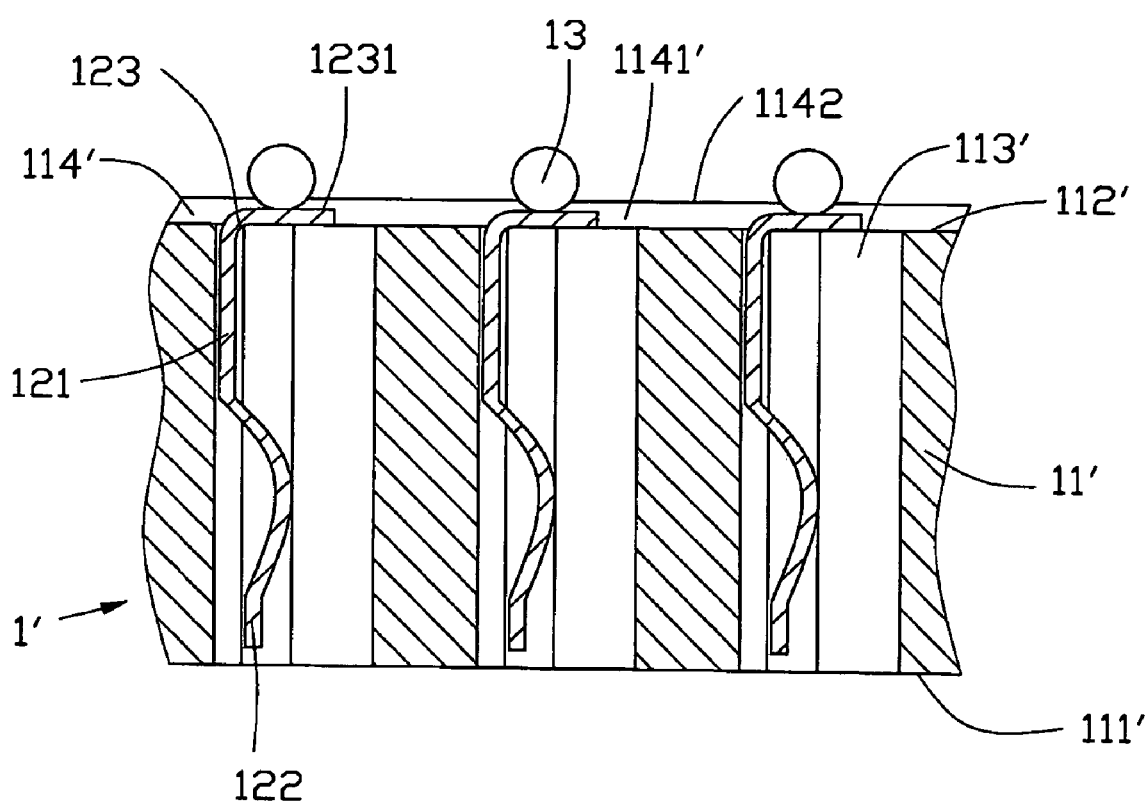
FIG. 6 is a cross-section view along a line VI—VI in FIG. 4

Referring to FIGS. 5–6, the insulative housing 11' includes a mating surface 111', a mounting surface 112' opposite to the mating surface 111' for mounting to a PCB, and a plurality of passageways 113' extending through the mating surface 111' and the mounting surface 112' for receiving the terminals 12 therein. A protecting device 114' is defined in the insulative housing 11' and includes a plurality of rectangular-parallelepiped portions, i.e., elongated ribs, 1140' installed on the mounting surface 112' of the insulative housing 11'. The rectangular-parallelepiped portions 1140' are arranged between two adjacent lengthwise rows of terminals 12 and each includes a base portion 1141' with a bottom surface 1142' distanced from the mounting surface 112'. Along a perpendicular direction relative to a top surface of the PCB, a vertical distance between the bottom surface 1142' and the mounting surface 112' is longer than another distance between a soldering surface 1231 of the terminal 12 and the mounting surface 112'. Hence, the soldering portion 123 of the terminal 12 can stave off unsuitable force to crash so that the electrical connecting between the BGA socket 1' and the PCB will not be affected.

It is noted that the passageway 113 is of a through hole type, and the solder portion 123 of the terminal 12 and the solder ball 13 thereon are fully embedded, from the top view, within the cross-section of the passageway 113 so as to allow the solder portion 123 with the associated solder ball 13 can upwardly pass through said passageway 113 during removal of the terminal 12 from the passageway 113 for replacement/rework, if necessary. On the other hand, the protecting device 114 which extends downwardly from the mounting surface 112, is only to prevent the solder portion 123, which is exposed, from a side view, outside the passageway 113 and under the mounting surface 112, from lateral attach for keeping the correct coplanarity/position of the solder portion 123 while having nothing to do with displacement of the solder ball 13 upon the solder portion 123. Understandably, the protecting device defines the protrusions thereof, may include the tiny discrete protrusions 1140 around the four corners of each individual grid/square corresponding to and surrounding, from the bottom view, the individual passageway 113 disclosed in the first embodiment for partial protection, or the slender discrete protrusions on the four sides (not shown) complementary to the aforementioned tiny protrusions in each corresponding aforementioned grid/square, or the elongated rib 1140' in the second embodiment for one dimensional protection, or the grid type protrusions (not shown) forming corresponding squares each encircling, from the bottom view, the corresponding passageway for two dimensional protection.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A BGA socket comprising:
   an insulative housing having a mating surface, a mounting surface opposite to the mating surface, a plurality of passageways extending through the mating surface and the mounting surface;
   a plurality of electrical terminals being received in the passageways of the insulative housing, respectively, each of the terminals comprising:
   a body portion, a contacting portion extending forwardly from the body portion and a soldering portion extending from the body portion and including a soldering surface extending beyond the mounting surface of the insulative housing; and
   a protecting device being arranged in the mounting surface, in a vertical direction, a distance between a bottom surface of the protecting device and the mounting surface being longer or equal to another distance between the soldering portion and the mounting surface.

2. The BGA socket of claim 1, wherein the protecting device comprises a plurality of lump-shaped protrusions and each of the protrusions is arranged between every two passageways.

3. The BGA socket of claim 1, wherein the protecting device comprises a plurality of rectangular-parallelepiped portions arranged between every two rows of the terminals.

4. The BGA socket of claim 1, wherein the protecting device is integrally formed with the insulative housing.

5. A BGA socket comprising:
   an insulative housing having a mating surface, a mounting surface opposite to the mating surface, a plurality of passageways extending through the mating surface and the mounting surface and a protecting device installed in the mounting surface;
   a plurality of electrical terminals being received in the passageways of the insulative housing, respectively, each of the terminals comprising:
   a body portion; a contacting portion extending forwardly from the body portion and a soldering portion extending from the body portion and including a soldering surface extending beyond the mounting surface of the insulative housing;
   a plurality of soldering elements each soldered with the soldering surface of the soldering portion;
   wherein, in a vertical direction, a distance between a bottom surface of the protecting device and the mounting surface is longer or equal to a distance between the soldering portion and the mounting surface, but is smaller than a distance between a bottom surface of the soldering element and the mounting surface after the soldering element is soldered with the soldering surface, wherein the bottom surface of the soldering element is located away from the soldering surface.

6. The BGA socket of claim 5, wherein the protecting device includes a plurality of lump-shaped protrusion and each of the protrusions is arranged between every two passageways.

7. The BGA socket of claim 5, wherein the protecting device includes a plurality of rectangular-parallelepiped portions arranged between every two rows of the terminals.

8. The BGA socket of claim 5, wherein the soldering elements are soldering balls.

9. The BGA socket of claim 5, wherein the protecting device is integrally formed with the insulative housing.

10. A BGA socket assembly comprising:
- an insulative housing defining opposite upward mating and downward mounting surfaces with a plurality of passageways extending between and through said mating and mounting surfaces;
- a plurality of contacts disposed in the corresponding passageways, respectively each of said contacts defining a horizontal mounting tail substantially at least partially exposed below the mounting surface;
- a plurality of solder balls each downwardly disposed upon a bottom surface of the corresponding mounting tail; and
- a plurality of protrusions integrally extending downwardly from the mounting surface and among said passageways so that from a bottom view, said protrusions and said passageways are arranged alternated with each other.

11. The assembly as claimed in claim 10, wherein the protrusion defines a first bottom surface which is not higher than a second bottom surface defined by the mounting tail of the neighboring terminal so that the mounting tail is efficiently protected from lateral improper exterior impact.

12. The assembly as claimed in claim 10, wherein for most of said passageways, each is equipped with at least one protrusion adjacent thereto.

13. The assembly as claimed in claim 12, wherein there are four protrusions closely surrounding said each passageway.

14. The assembly as claimed in claim 13, wherein said four protrusions are located at four corners around said corresponding passageway.

15. The assembly as claimed in claim 10, wherein for most of said mounting tails, each is not fully circumferentially surrounded by the corresponding protrusions but with lateral gaps thereabout.

16. The assembly as claimed in claim 15, wherein there are four protrusions closely surrounding said each mounting tail.

17. The assembly as claimed in claim 16, wherein said four protrusions are located at four corners around said corresponding mounting tail.

18. The assembly as claimed in claim 10, wherein said protrusion are arranged to be parallel elongated ribs to sandwich corresponding row of said passageways, respectively, between every adjacent two elongated ribs.

* * * * *